(12) United States Patent
Kainuma et al.

(10) Patent No.: US 7,833,831 B2
(45) Date of Patent: Nov. 16, 2010

(54) METHOD OF MANUFACTURING AN ELECTRONIC COMPONENT AND AN ELECTRONIC DEVICE

(75) Inventors: Norio Kainuma, Kawasaki (JP);
 Kuniko Ishikawa, Kawasaki (JP);
 Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 396 days.

(21) Appl. No.: 11/951,693

(22) Filed: Dec. 6, 2007

(65) Prior Publication Data
US 2008/0206587 A1 Aug. 28, 2008

(30) Foreign Application Priority Data
Feb. 22, 2007 (JP) .............................. 2007-041545

(51) Int. Cl.
 *H01L 21/00* (2006.01)
(52) U.S. Cl. ...................................... 438/108; 257/778
(58) Field of Classification Search ......... 438/107–109; 257/778
See application file for complete search history.

(56) References Cited
U.S. PATENT DOCUMENTS
5,973,406 A 10/1999 Harada et al.
6,454,159 B1 * 9/2002 Takushima .................. 228/253
6,761,302 B1 7/2004 Kaneyama FOREIGN PATENT DOCUMENTS
| JP | 8-203904 | 8/1996 |
| JP | 10-70153 | 3/1998 |
| JP | 11-163199 | 6/1999 |
| JP | 2000-77471 | 3/2000 |
| JP | 3123707 | 10/2000 |

* cited by examiner

*Primary Examiner*—Leonardo Andújar
(74) *Attorney, Agent, or Firm*—Staas & Halsey LLP

(57) ABSTRACT

An electronic component is equipped with electrode protrusions that make it possible to mount the electronic component without covering connection pads of a circuit board with solder and to dispose the connection pads of the circuit board with a narrow pitch while preventing electrical shorting of the connection electrodes during mounting. A method of manufacturing an electronic component equipped with connection electrodes, where electrode protrusions are covered with solder, includes a step of heating a solder sheet to a semi-molten state and pressing the electronic component onto the solder sheet to place the electrode protrusions in contact with the solder sheet and a step of retracting the electronic component from a position where the electrode protrusions contact the solder sheet to transfer solder onto outside surfaces of the electrode protrusions that contacted the solder sheet.

10 Claims, 4 Drawing Sheets

METHOD OF MANUFACTURING AN ELECTRONIC COMPONENT AND AN ELECTRONIC DEVICE

BACKGROUND OF THE INVENTION

1. Field of the Invention

The present invention relates to an electronic component equipped with connection electrodes where electrode protrusions are covered with solder and a method of manufacturing the same, and also to an electronic device produced by mounting such electronic component on a circuit board or the like and a method of manufacturing the same.

2. Related Art

Methods of mounting a semiconductor chip on a circuit board by flip-chip bonding include a method of forming solder bumps used for connecting on electrodes of the semiconductor chip to bond the semiconductor chip to the circuit board and a method that covers connection pads formed on the circuit board with solder and aligning and bonding the electrodes of the semiconductor chip and the connection pads.

Methods of forming solder bumps on the electrodes of a semiconductor chip include a method that forms a solder layer in the form of dots on a carrier chip and transfers the solder layer onto the electrodes of the semiconductor chip (see Patent Document 1) and a method that forms solder bumps by placing a solder sheet in contact with the electrodes of the semiconductor chip in a state where the electrodes are heated so as to melt the solder and cause the solder to adhere to the electrodes (see Patent Document 2).

Methods of covering connection pads of a circuit board with solder include solder cream printing and solder plating. Among methods for covering connection pads of a circuit board with solder and bonding the circuit board to a semiconductor chip, for cases where the electrodes of the semiconductor chip have an extremely narrow pitch, there is a method that forms protruding stud bumps ("electrode protrusions") on the electrodes of the semiconductor chip, sticks fine solder powder onto the connection pads of the circuit board, and melts the solder on the connection pads to bond the electrode protrusions and the connection pads (see Patent Document 5).

Patent Document 1
    Japanese Laid-Open Patent Publication No. H10-229087

Patent Document 2
    Japanese Laid-Open Patent Publication No. H8-203904

Patent Document 3
    Japanese Laid-Open Patent Publication No. H11-163199

Patent Document 4
    Japanese Laid-Open Patent Publication No. H10-70153

Patent Document 5
    Japanese Laid-Open Patent Publication No. 2000-77471

SUMMARY OF THE INVENTION

As described earlier, with a method that covers the connection pads of a circuit board with solder in advance, it is necessary to carry out a process such as solder cream printing or solder plating on the substrate, which raises the manufacturing cost. Also, when the electrodes of a semiconductor chip have an extremely narrow pitch, the connection pads of the circuit board will also have a narrow pitch, which increases the likelihood of the connection pads being electrically shorted by the solder.

Also, the semiconductor chip is heated when the semiconductor chip is bonded to the circuit board. Since the semiconductor chip has a high thermal conductivity compared to the circuit board, there is the problem of solder flowing up onto the electrode protrusions when the solder supplied onto the connection pads of the circuit board melts, which makes the bonding of the semiconductor chip unreliable.

The present invention was conceived in view of the problems described above, and it is an object of the present invention to provide an electronic component equipped with electrode protrusions that are formed at a narrow pitch, that make a process of covering connection pads of a circuit board with solder unnecessary, and enable the connection pads of the circuit board to be disposed at a narrow pitch, and is an electronic component that can be mounted while avoiding electrical shorting between the connection electrodes. It is also an object of the present invention to provide a method of manufacturing such electronic component, an electronic device that uses such electronic component, and a method of manufacturing such electronic device.

To achieve the stated object, a method of manufacturing according to the present invention manufactures an electronic component equipped with connection electrodes where electrode protrusions are covered with solder, including steps of: heating a solder sheet to a semi-molten state and pressing an electronic component onto the solder sheet to place the electrode protrusions in contact with the solder sheet; and retracting the electronic component from a position where the electrode protrusions contact the solder sheet to transfer solder onto outer surfaces of the electrode protrusions that contacted the solder sheet.

Here, the solder sheet may be supported by a heating stage, the electronic component may be supported by a heating head, and the solder sheet and the electronic component may be pressed together by the heating stage and the heating head to press the electrode protrusions onto the solder sheet and thereby favorably transfer solder from the solder sheet to the electrode protrusions.

The heating stage and the heating head may heat the solder sheet to a temperature where a semi-molten state is achieved and a heating temperature of the heating stage may be set higher than a heating temperature of the heating head. By doing so, it is possible to reliably cover the electrode protrusions with solder.

Also, ultrasound may be applied to the electronic component when the electrode protrusions are pressed onto the solder sheet. By doing so, it is possible to transfer solder onto the electrode protrusions without raising the heating temperature of the solder sheet.

A method where the solder sheet is supported by a heating stage, the electronic component is supported by an ultrasonic head, the solder sheet and the electronic component are pressed together by the heating stage and the ultrasonic head, and the electrode protrusions are pressed onto the solder sheet while ultrasound is applied to the electronic component using the ultrasonic head is also effective.

Also, by carrying out an operation that presses the electrode protrusions onto the solder sheet with the ultrasound being applied to the electronic component in a nitrogen atmosphere, it is possible to prevent fretting corrosion of the solder formed on the electrode protrusions.

For a method of manufacturing an electronic device by mounting an electronic component equipped with connection electrodes, where electrode protrusions are covered with solder, onto a circuit board on which connection pads are formed by bonding the connection electrodes to the connection pads, the electronic component is formed by heating a solder sheet to a semi-molten state and pressing the electronic component onto the solder sheet to place the electrode protrusions in contact with the solder sheet and then retracting the electronic component from a position where the electrode protrusions contact the solder sheet to transfer solder onto outer surfaces of the electrode protrusions that contacted the solder sheet, and the method of manufacturing an electronic device includes a step of aligning the connection electrodes of the electronic component with the connection pads of the circuit board and heating to a temperature where the solder melts to bond the electronic component and the circuit board.

It is effective to use an electronic component where the solder has been transferred from the solder sheet to the electrode protrusions by applying ultrasound to the electronic component when the electrode protrusions were pressed onto the solder sheet as the electronic component.

The circuit board may be supported on a heating stage, the electronic component may be supported on a mounting heating head, the heating stage may be heated to at least a melting point of the solder, and a heating temperature of the mounting heating head may be set lower than a temperature of the heating stage to bond the electronic component and the circuit board. By doing so, it is possible to prevent the solder from flowing up onto the electrode protrusions and thereby reliably bond the electrode protrusions and the connection pads.

Flux fill may be applied in advance onto a region of the circuit board where the electronic appliance will be mounted, the connection electrodes of the electronic component and the connection pads of the circuit board may be aligned, the electronic component and the circuit board may be heated to a temperature where the solder melts, and the flux fill may be thermally cured to bond the electronic component and the circuit board. By doing so, it is possible to reliably bond the electrode protrusions and the connection pads, to seal the bonded part of the electronic component and the circuit board, and to reliably support the bonded part of the electronic component and the circuit board.

As the electronic component equipped with connection electrodes where electrode protrusions are covered with solder, an electronic component that has been formed by a method of manufacturing including steps of: heating a solder sheet to a semi-molten state and pressing an electronic component onto the solder sheet to place the electrode protrusions in contact with the solder sheet; and retracting the electronic component from a position where the electrode protrusions contact the solder sheet to transfer solder onto outer surfaces of the electrode protrusions that contacted the solder sheet can be favorably used.

For an electronic device formed by mounting an electronic component equipped with connection electrodes, where electrode protrusions are covered with solder, onto a circuit board on which connection pads are formed by bonding the connection electrodes to the connection pads, it is favorable for the electronic component to be formed by heating a solder sheet to a semi-molten state and pressing the electronic component onto the solder sheet to place the electrode protrusions in contact with the solder sheet and then retracting the electronic component from a position where the electrode protrusions contact the solder sheet to transfer solder onto outer surfaces of the electrode protrusions that contacted the solder sheet, and for the electronic device to be formed by a method of manufacturing including a step of aligning the connection electrodes of the electronic component with the connection pads of the circuit board and heating to a temperature where the solder melts to bond the electronic component and the circuit board.

With a method of manufacturing an electronic component and an electronic device according to the present invention, by transferring solder from a solder sheet to electrode protrusions of the electronic component to form connection terminals for mounting on the electronic component, connection electrodes can be easily formed on the electronic component. It is also possible to prevent electrical shorting of the electrode protrusions, so that even an electronic component on which the electrode protrusions have been formed with an extremely narrow pitch can be mounted reliably. Also, by forming the connection electrodes on the electronic component, it is possible to easily manufacture a circuit board on which connection pads are formed with a high density while preventing electrical shorting of the connection pads.

DESCRIPTION OF THE PREFERRED EMBODIMENTS

Method of Manufacturing an Electronic Component

First Embodiment

Figure 1A:
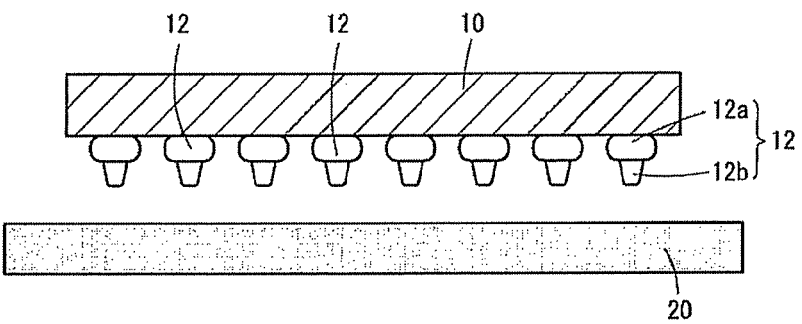
FIGS. 1A to 1C are schematic diagrams showing a manufacturing process according to a first embodiment of a method of manufacturing an electronic component.
Figure 1B:
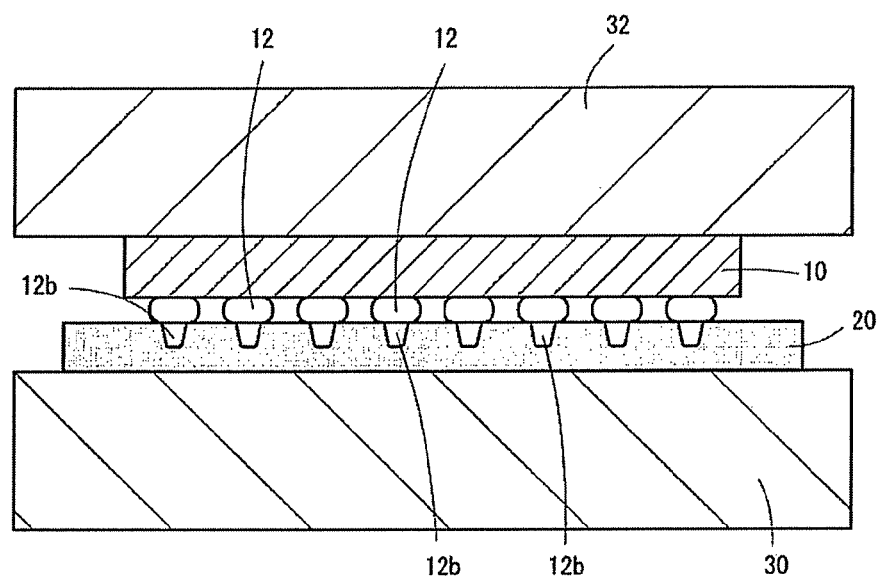
Figure 1C:
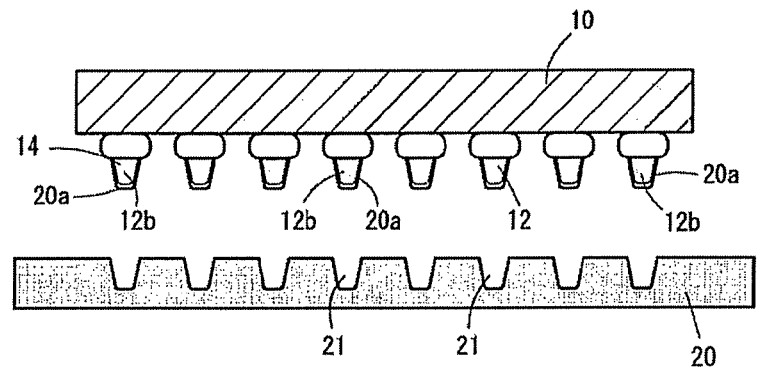

FIGS. 1A to 1C show a process that manufactures an electronic component on which connection electrodes are formed by covering the outer surfaces of electrode protrusions of a semiconductor chip with solder. FIG. 1A shows a state where electrode protrusions 12 have been formed on electrodes of the semiconductor chip 10. The electrode protrusions 12 are formed by a method called "ball bonding". Ball portions 12a are formed by melting metal wire using a bonding tool, the respective electrodes (not shown) of the semiconductor chip 10 are pressed into contact with the ball portions 12a, and protruding parts 12b are formed by cutting the metal wires while pulling on the wires. The protruding parts 12b are formed in peaks on the ball portions 12a that are slightly flattened.

In the method of manufacturing an electronic component according to the present invention, connection electrodes are formed by covering the outer surfaces of the electrode protrusions 12 formed on the semiconductor chip 10 with solder using a solder sheet 20. FIG. 1A schematically shows the semiconductor chip 10, on which the electrode protrusions 12 have been formed, and the solder sheet 20. As the solder sheet 20, products of a variety of thicknesses are provided as mill rolls. Here, a solder sheet 20 of a suitable thickness should be selected in accordance with the height of the parts of the electrode protrusions 12 to be covered with solder.

Since the height of the electrode protrusions 12 of the semiconductor chip 10 in the present embodiment is around 30 µm, a sheet with a thickness of 50 µm is used as the solder sheet 20. The solder sheet 20 used in the present embodiment is made of Sn—Ag (tin-silver) solder, and the melting point thereof is 220° C.

FIG. 1B shows a process where the semiconductor chip 10 is pressed onto the solder sheet 20 so that the protruding parts 12b of the electrode protrusions 12 penetrate and become buried in the solder sheet 20. The solder sheet 20 is supported and heated on a heating stage 30 and the semiconductor chip 10 is held by suction on a mounting/heating head 32. The surface of the semiconductor chip 10 on which the electrode protrusions 12 are formed is disposed in parallel with the surface of the solder sheet 20 supported on the heating stage 30 and the mounting/heating head 32 is pressed toward the solder sheet 20.

The semiconductor chip 10 and the solder sheet 20 are pressed together by the mounting/heating head 32 and the heating stage 30 and the protruding parts 12b of the electrode protrusions 12 on the semiconductor chip 10 are pressed into the solder sheet 20. Since the electrode protrusions 12 are formed so that the protruding parts 12b project outward from the ball portions 12a, the insertion positions of the electrode protrusions 12 are restricted when the protruding parts 12b are buried in the solder sheet 20.

In the process shown in FIG. 1B, the heating stage 30 and the mounting/heating head 32 are heated and controlled so that the solder sheet 20 becomes semi-molten. Here, "semi-molten" refers to a temperature range that is at or below the melting temperature and is where the solder sheet 20 becomes soft. This is an intermediate state between where the solder is completely hard and where the solder is a liquid, or in other words where solid-phase solder and liquid-phase solder coexist. In this semi-molten phase, the solder sheet remains in a sheet-like state. The melting point for the Sn—Ag solder used in the present embodiment is 220° C., and the semi-molten state starts at around 170° C.

To place the solder sheet 20 in a semi-molten state and transfer the solder from the solder sheet 20 to the electrode protrusions 12, the temperature of the mounting/heating head 32 in the present embodiment is set at around 150° C. and the temperature of the heating stage 30 is set at around 190° C. The temperature of the mounting/heating head 32 is set lower than the temperature of the heating stage 30 so that solder is not excessively transferred to the electrode protrusions 12. If the temperature of the mounting/heating head 32 rises to around the melting point of the solder, when the electrode protrusions 12 are in contact with the solder sheet 20, the solder will rise up onto the outer surfaces of the electrode protrusions 12, resulting in an increase in the amount of transferred solder adhering to the electrode protrusions 12. Accordingly, the heating temperature of the mounting/heating head 32 should be set at a low end of the semi-molten temperature range of the solder sheet 20 or slightly below the semi-molten temperature range. On the other hand, the heating stage 30 is set at a high end of the semi-molten temperature range of the solder. By doing so, it becomes easier for the electrode protrusions 12 to penetrate the solder sheet 20, so that the solder can easily adhere to the electrode protrusions 12.

FIG. 1C shows a state where the semiconductor chip 10 has been separated from the solder sheet 20 after the process in FIG. 1B. Solder 20a covers the outer surfaces of the protruding parts 12b of the electrode protrusions 12 on the semiconductor chip 10 that were inserted into the solder sheet 20, thereby producing an electronic component where connection electrodes 14 used for connecting the electronic component are formed. Concave parts 21 where the protruding parts 12b of the electrode protrusions 12 were inserted are formed in the solder sheet 20.

The thickness of the solder 20a that covers the protruding parts 12b of the electrode protrusions 12 is 2 to 3 μm on average, and has a maximum of around 5 μm. By causing the solder 20a to adhere with this thickness on the electrode protrusions 12, connection pads formed on a circuit board can be reliably soldered to the electrode protrusions 12.

This method of the present embodiment where the solder sheet 20 is placed in a semi-molten state and solder is transferred from the solder sheet 20 to the electrode protrusions 12 to form the connection electrodes 14 has an advantage in that it is possible to easily form connection electrodes on the semiconductor chip 10. Since the electrode protrusions 12 are thinly covered with the solder 20a, compared to a method where solder is melted and attached to electrodes to form solder bumps, there is the advantage that it is possible to form connection electrodes without electrically shorting the electrode protrusions 12, even when the electrode protrusions 12 are formed with an extremely narrow pitch.

Method of Manufacturing an Electronic Component

Second Embodiment

Figure 2A:
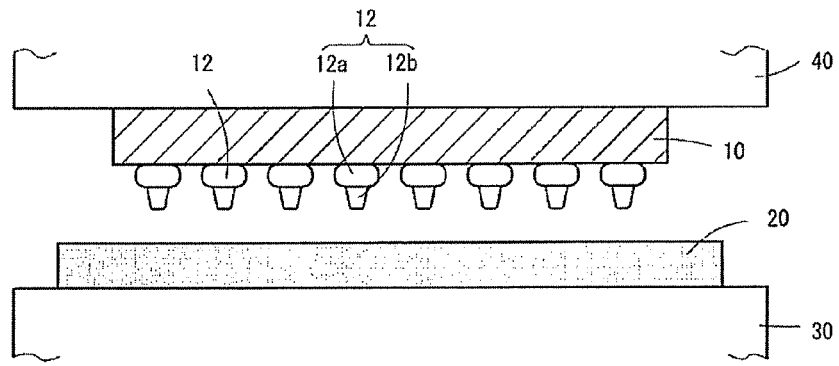
FIGS. 2A to 2C are schematic diagrams showing a manufacturing process in a second embodiment of a method of manufacturing an electronic component.
Figure 2B:
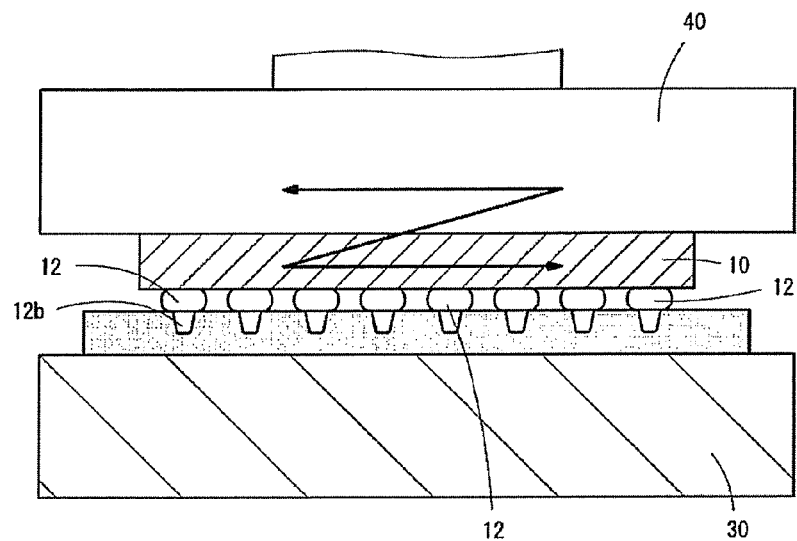
Figure 2C:
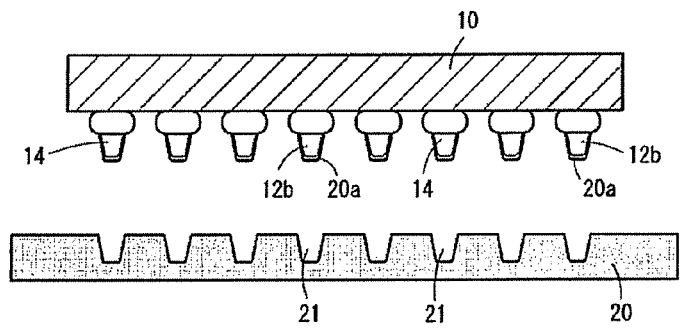

FIGS. 2A to 2C show a second embodiment where solder is transferred onto the electrode protrusions 12 provided on the electrodes of the semiconductor chip 10 using the solder sheet 20.

In the present embodiment, the semiconductor chip 10 is held by suction on an ultrasonic head 40 and when solder is transferred from the solder sheet 20 onto the electrode protrusions 12 of the semiconductor chip 10, ultrasound is applied to the semiconductor chip 10 to transfer the solder onto the electrode protrusions 12.

FIG. 2A shows a state where the solder sheet 20 is supported on the heating stage 30 and the semiconductor chip 10 is held by suction on the ultrasonic head 40 with the electrode protrusions 12 facing the solder sheet 20. FIG. 2B shows a state where the semiconductor chip 10 is pressed on the solder sheet 20 supported on the heating stage 30 and ultrasound is applied by the ultrasonic head 40 in a state where the protruding parts 12b of the electrode protrusions 12 have penetrated the solder sheet 20. Here, around 0.5 seconds is sufficient as the time for which ultrasonic vibration is applied in a state where the protruding parts 12b have penetrated the solder sheet 20.

In the same way as in the first embodiment, the solder sheet 20 is heated to a semi-molten state by the heating stage 30 and the semiconductor chip 10 is heated by the ultrasonic head 40, so that solder is transferred from the solder sheet 20 to the electrode protrusions 12. When solder is transferred by applying ultrasound to the semiconductor chip 10 like in the present embodiment, compared to the case where ultrasonic vibration is not used, it is possible to transfer solder with the heating temperature of the heating stage 30 set lower. For example, when the solder sheet 20 is made of the Sn—Ag solder used in the present embodiment, the heating temperature of the heating stage 30 may be set at around 170° C. Here, it is believed that when the electrode protrusions 12 are placed in contact with the solder sheet 20 and ultrasonic vibration is applied to the semiconductor chip 10, the temperature will rise due to friction at the parts where the electrode protrusions 12 contact the solder sheet 20.

Since it is possible to lower the heating temperature of the solder sheet 20 with a method where solder is transferred from the solder sheet 20 to the electrode protrusions 12 by applying ultrasound to the semiconductor chip 10 like in the present embodiment, there is the advantage that the solder sheet 20 retains its shape more favorably than in the first embodiment, which makes it easier to handle the solder sheet 20. When ultrasonic vibration is applied to the semiconductor chip 10, the protruding parts 12b of the electrode protrusions 12 that have penetrated the solder sheet 20 rub against the solder sheet 20, so that solder can be reliably transferred to the parts of the protruding parts 12b that contact the solder sheet 20.

FIG. 2C shows an electronic component where solder 20a has been transferred from the solder sheet 20 to the protruding parts 12b of the electrode protrusions 12 to form the connection electrodes 14 and also shows the solder sheet 20 after the solder has been transferred. In the present embodiment also, since the electrode protrusions 12 are covered with the solder 20a with the solder sheet 20 in a semi-molten state, the solder 20a only thinly adheres to the outer surfaces of the protruding parts 12b, and therefore electrical shorting of the electrode protrusions 12 can be prevented, even if the electrode protrusions 12 are disposed at a narrow pitch.

However, when ultrasound is applied to the semiconductor chip 10 to transfer the solder from the solder sheet 20 to the electrode protrusions 12, there are cases where the friction between the electrode protrusions 12 and the solder sheet 20 causes fretting corrosion which produces an oxide film on the contacting parts of the electrode protrusions 12 and the solder. It is possible to easily tell whether an oxide film has been produced on the solder 20a transferred onto the electrode protrusions 12 since the solder becomes blackened when an oxide film is formed.

To prevent fretting corrosion from occurring, the operation that applies ultrasound to the semiconductor chip 10 and transfers solder onto the electrode protrusions 12 from the solder sheet 20 should be carried out in a non-oxygenated atmosphere. More specifically, the area where the solder is transferred may be closed off from the outside and the operation carried out with such area in a nitrogen atmosphere. As a simple method, when ultrasound is applied by the ultrasonic head 40 and the semiconductor chip 10 is pressed onto the solder sheet 20, nitrogen gas may be blown toward the contacting parts of the semiconductor chip 10 and the solder sheet 20.

Figure 3A:
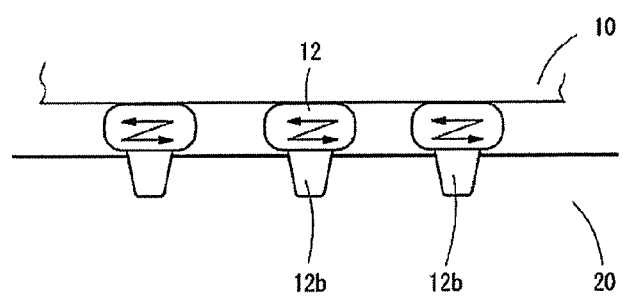
FIGS. 3A to 3C are schematic diagrams showing one example of where fretting corrosion of electrode protrusions is prevented.
Figure 3B:
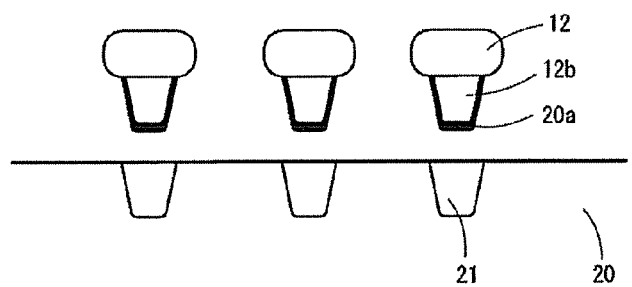
Figure 3C:
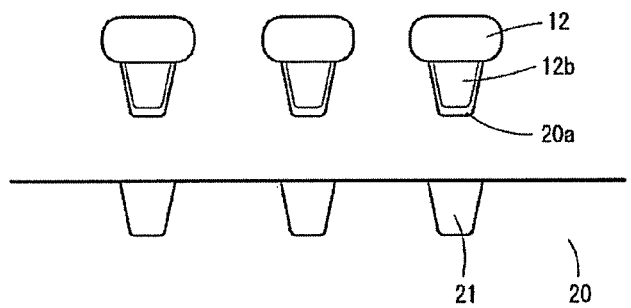

FIG. 3A shows a state where ultrasonic vibration is applied onto the electrode protrusions 12 in a state where the protruding parts 12b of the electrode protrusions 12 have penetrated the solder sheet 20. FIG. 3B schematically shows a state where fretting corrosion has occurred and the solder 20a covering the protruding parts 12b of the electrode protrusions 12 has been oxidized. On the other hand, FIG. 3A shows a state where the solder 20a has been transferred without the solder 20a being blackened and an oxide film being produced by transferring the solder 20a onto the electrode protrusions 12 in a nitrogen atmosphere.

In this way, according to a method that applies ultrasound to the semiconductor chip 10 to transfer solder onto the electrode protrusions 12 from the solder sheet 20 in a nitrogen atmosphere, it is possible to suppress oxidization of the solder 20a that covers the electrode protrusions 12, which means that soldering can be carried out reliably when mounting the electronic component.

Note that although examples of electronic components where the electrode protrusions 12 are formed by ball bonding on the electrodes of the semiconductor chip 10 have been described in the above embodiments, the present invention is not limited to the electrode protrusions 12 formed on the electrodes of the semiconductor chip 10 being formed by ball bonding. Also, although examples where the electrode protrusions 12 are formed of the ball portions 12a and the protruding parts 12b have been described in the above embodiments, the form of the electrode protrusions formed on the electrodes of the semiconductor chip 10 is not limited to the form described in the above embodiments. However, in the method of manufacturing an electronic component according to the present invention, since the solder is transferred to the electrode protrusions in a state where at least the front end portions of the electrode protrusions have penetrated the solder sheet 20, it is effective for the front ends of the protruding portions of the electrode protrusions to be formed in peaked shapes.

Method of Manufacturing an Electronic Device

Third Embodiment

Figure 4A:
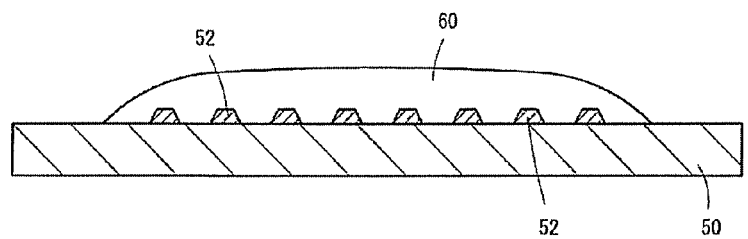
FIGS. 4A to 4C are schematic diagrams showing a method of manufacturing an electronic device.
Figure 4B:
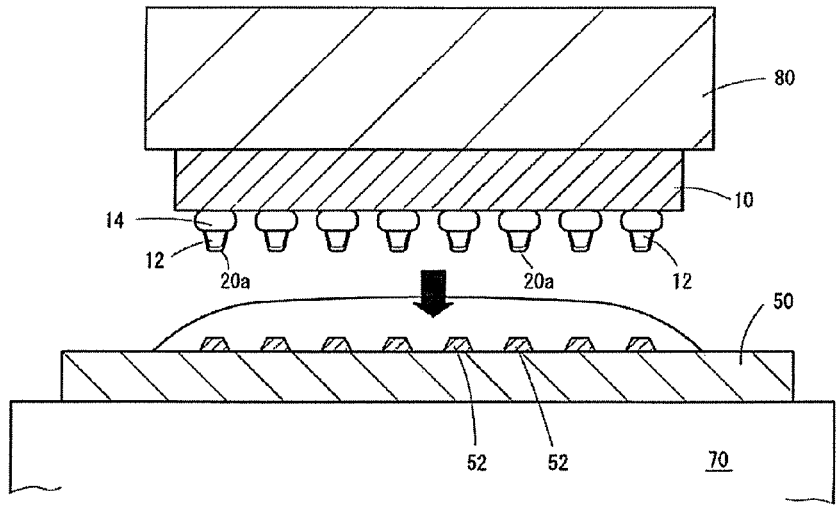
Figure 4C:
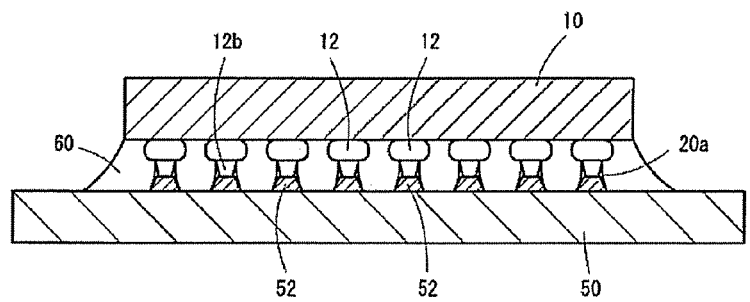

FIGS. 4A to 4C show an example of a manufacturing process that mounts an electronic component where connection electrodes 14 have been formed by covering electrode protrusions 12 with solder 20a on a circuit board to assemble an electronic device. The electronic device according to the present embodiment is formed by flip-chip bonding the semiconductor chip 10 to a circuit board 50 and sealing the bonded part of the semiconductor chip 10 and the circuit board 50 using resin to fix the semiconductor chip 10 on the circuit board 50.

A method of manufacturing an electronic device according to the present embodiment mounts the semiconductor chip 10 on the circuit board 50 by flip-chip bonding after applying flux fill 60 in advance to a region of the circuit board 50 where the semiconductor chip 10 will be mounted.

FIG. 4A shows a state where the flux fill 60 has been applied onto the region of the circuit board 50 where the semiconductor chip 10 will be mounted. Connection pads 52 are formed at the position of the circuit board 50 where the semiconductor chip 10 is mounted so that the positions of the connection pads 52 match the planar arrangement of the electrode protrusions 12 that are the connection portions formed on the semiconductor chip 10.

The flux fill 60 acts as flux that ensures sufficient bonding between the electrode protrusions 12 and the connection pads 52 when the semiconductor chip 10 is mounted on the circuit board 50 and, after the semiconductor chip 10 has been mounted on the circuit board 50, also acts as underfill resin that fills the gap between the semiconductor chip 10 and the circuit board 50 and fixes and supports the semiconductor chip 10 on the circuit board 50.

FIG. 4B shows a state where the circuit board 50 is set on a heating stage 70 and the semiconductor chip 10 is held by suction on a heating head 80 used for mounting and is positioned on and bonded to the circuit board 50. The electrode protrusions 12 of the semiconductor chip 10 and the connection pads 52 formed on the circuit board 50 are aligned and the semiconductor chip 10 is bonded to the circuit board 50 by applying pressure and heat.

FIG. 4C shows a state where the semiconductor chip 10 has been bonded to the circuit board 50 to assemble an electronic device. The electrode protrusions 12 formed on the semiconductor chip 10 are respectively soldered to the connection pads 52 formed on the circuit board 50, the gap between the semiconductor chip 10 and the circuit board 50 is filled with the flux fill 60, and the bonded part of the semiconductor chip 10 and the circuit board 50 is sealed.

By pressing the semiconductor chip 10 onto the circuit board 50 and heating to the temperature at which the solder 20a melts, the solder can spread out between the electrode protrusions 12 and the connection pads 52 and solder the electrode protrusions 12 and the connection pads 52 together. By maintaining the pressure and heat in this state, the flux fill 60 is cured to firmly fix the semiconductor chip 10 to the circuit board 50.

When heat and pressure are applied to the semiconductor chip 10 on the circuit board 50, the temperature of the heating head 80 that applies heat and pressure to the semiconductor chip 10 should be set lower than the temperature of the heating stage 70 that supports the circuit board 50. By doing so, the solder 20a that covers the electrode protrusions 12 on the semiconductor chip 10 spreads from the electrode protrusions 12 onto the connection pads 52 of the circuit board 50, so that the electrode protrusions 12 and the connection pads 52 are reliably soldered together.

Here, by setting the heating temperature of the semiconductor chip 10 lower than the melting point of the solder 20a and setting the heating temperature of the circuit board 50 higher than the melting point of the solder 20a, it is possible to prevent solder from flowing up from the connection pads 52 to the electrode protrusions 12, so that the semiconductor chip 10 and the circuit board 50 can be soldered together more reliably.

Note that although a method where the semiconductor chip 10 is mounted with the flux fill 60 having been applied in advance onto the circuit board 50 has been described in the above embodiment, it is also possible to produce an electronic device by injecting underfill resin into the bonded part between the semiconductor chip 10 and the circuit board 50 after the semiconductor chip 10 has been bonded to the circuit board 50. A method that mounts the semiconductor chip 10 by supplying the flux fill 60 onto the circuit board 50 in advance can be effectively used when manufacturing an electronic device where the electrode protrusions 12 have an extremely narrow pitch, which makes underfilling difficult.

With the method of manufacturing an electronic device according to the present embodiment, since the solder 20a covers the electrode protrusions 12 of the semiconductor chip 10 and solder is not supplied to the connection pads 52 of the circuit board 50, the processing of the circuit board 50 is simple. Even if the connection pads 52 are formed with a minute pitch, it is possible to avoid the electrical shorting of adjacent connection pads 52 due to supplied solder, which means it is possible to form the circuit board 50 in an extremely fine pattern.

For the semiconductor chip 10 also, since transferring the solder 20a to the electrode protrusions 12 from the solder sheet 20 makes it possible to form a semiconductor chip (electronic component) with electrode protrusions 12 formed with a narrow pitch, reliable mounting on a circuit board is possible, even for a semiconductor chip with electrodes disposed with a high density.

Note that although a semiconductor chip has been given as an example of an electronic component in the above embodiments, in some cases it is also possible to apply the method according to the present invention to mounting a semiconductor package on which a semiconductor chip has been mounted. In such cases, the semiconductor package corresponds to the "electronic component" and a product where the semiconductor package has been mounted on a mounting board corresponds to the "electronic device".

What is claimed is:

1. A method of manufacturing an electronic component equipped with connection electrodes where electrode protrusions are covered with solder, comprising steps of:
   heating a solder sheet to a semi-molten state and pressing an electronic component onto the solder sheet to place the electrode protrusions in contact with the solder sheet; and
   retracting the electronic component from a position where the electrode protrusions contact the solder sheet to transfer solder onto outer surfaces of the electrode protrusions that contacted the solder sheet.

2. A method of manufacturing an electronic component according to claim 1,
   wherein the solder sheet is supported by a heating stage, the electronic component is supported by a heating head, and the solder sheet and the electronic component are pressed together by the heating stage and the heating head to press the electrode protrusions onto the solder sheet.

3. A method of manufacturing an electronic component according to claim 2,
   wherein the heating stage and the heating head heat the solder sheet to a temperature where a semi-molten state is achieved and a heating temperature of the heating stage is set higher than a heating temperature of the heating head.

4. A method of manufacturing an electronic component according to claim 1,
   wherein ultrasound is applied to the electronic component when the electronic component is pressed onto the solder sheet.

5. A method of manufacturing an electronic component according to claim 4,
   wherein the solder sheet is supported by a heating stage, the electronic component is supported by an ultrasonic head, and the solder sheet and the electronic component are pressed together by the heating stage and the ultrasonic head, and the electrode protrusions are pressed onto the solder sheet with the ultrasound being applied to the electronic component by the ultrasonic head.

6. A method of manufacturing an electronic component according to claim 4,
   wherein an operation that presses the electrode protrusions onto the solder sheet with the ultrasound being applied to the electronic component is carried out in a nitrogen atmosphere.

7. A method of manufacturing an electronic device by mounting an electronic component equipped with connection electrodes, where electrode protrusions are covered with solder, onto a circuit board on which connection pads are formed by bonding the connection electrodes to the connection pads,
   wherein the electronic component is formed by heating a solder sheet to a semi-molten state and pressing the electronic component onto the solder sheet to place the electrode protrusions in contact with the solder sheet and then retracting the electronic component from a position where the electrode protrusions contact the solder sheet to transfer solder onto outer surfaces of the electrode protrusions that contacted the solder sheet,
   and the method of manufacturing an electronic device comprises a step of aligning the connection electrodes of the electronic component with the connection pads of the circuit board and heating to a temperature where the solder melts to bond the electronic component and the circuit board.

8. A method of manufacturing an electronic device according to claim 7,
   wherein an electronic component where the solder has been transferred from the solder sheet to the electrode protrusions by applying ultrasound to the electronic component when the electronic component was pressed onto the solder sheet is used as the electronic component.

9. A method of manufacturing an electronic device according to claim 7, wherein the circuit board is supported on a heating stage, the electronic component is supported on a mounting heating head, and the electronic component and the circuit board are bonded with the heating stage heated to at least a melting point of the solder and a heating temperature of the mounting heating head set lower than a temperature of the heating stage.

10. A method of manufacturing an electronic device according to claim 7, wherein flux fill is applied in advance onto a region of the circuit board where the electronic appliance will be mounted, the connection electrodes of the electronic component and the connection pads of the circuit board are aligned, the electronic component and the circuit board are heated to a temperature where the solder melts, and the flux fill is thermally cured to bond the electronic component and the circuit board.

* * * * *